United States Patent
Coussy et al.

(10) Patent No.: US 9,971,684 B2
(45) Date of Patent: May 15, 2018

(54) SELF-CONFIGURABLE DEVICE FOR INTERLEAVING/DEINTERLEAVING DATA FRAMES

(71) Applicants: UNIVERSITE DE BRETAGNE SUD, Lorient (FR); CENTRE NATIONAL DE LA RECHERCHE SCIENTIFIQUE—CNRS, Paris (FR)

(72) Inventors: Philippe Coussy, Ploemeur (FR); Cyrille Chavet, Lorient (FR)

(73) Assignees: UNIVERSITE DE BRETAGNE SUD, Lorient (FR); CENTRE NATIONAL DE LA RECHERCHE SCIENTIFIQUE—CNRS, Paris (FR)

( * ) Notice: Subject to any disclaimer, the term of this patent is extended or adjusted under 35 U.S.C. 154(b) by 0 days. days.

(21) Appl. No.: 14/380,554

(22) PCT Filed: Feb. 22, 2013

(86) PCT No.: PCT/EP2013/053613
§ 371 (c)(1),
(2) Date: Aug. 22, 2014

(87) PCT Pub. No.: WO2013/124449
PCT Pub. Date: Aug. 29, 2013

(65) Prior Publication Data
US 2015/0301940 A1 Oct. 22, 2015

(30) Foreign Application Priority Data
Feb. 23, 2012 (FR) .................................... 12 51688

(51) Int. Cl.
| G06F 12/10 | (2016.01) |
|---|---|
| G06F 12/06 | (2006.01) |
| H03M 13/27 | (2006.01) |
| H03M 13/00 | (2006.01) |
| G06F 13/28 | (2006.01) |
| H03M 13/11 | (2006.01) |

(52) U.S. Cl.
CPC .......... *G06F 12/0607* (2013.01); *G06F 13/28* (2013.01); *H03M 13/2764* (2013.01);
(Continued)

(58) Field of Classification Search
CPC ............................. G06F 12/0607; G06F 13/28
(Continued)

(56) References Cited

U.S. PATENT DOCUMENTS

| 8,327,033 B2 | 12/2012 | Chavet et al. |
| 8,332,701 B2 | 12/2012 | Lee et al. |
(Continued)

FOREIGN PATENT DOCUMENTS

| EP | 1 850 486 | 10/2007 |
| FR | 2675970 | 10/1992 |
| FR | 2838581 | 10/2003 |

OTHER PUBLICATIONS

PCT/EP2013/053613 International Search Report dated Jun. 27, 2013 (6 pages including English translation).
(Continued)

*Primary Examiner* — Jae Yu
(74) *Attorney, Agent, or Firm* — Brinks Gilson & Lione; G. Peter Nichols

(57) ABSTRACT

A device for interleaving/deinterleaving digital data delivered by processing elements (P0 . . . Pn-1) suitable for being used both with turbo-codes and with LDPC codes. The device includes memory banks (B0 . . . Bm-1) for storing data coming from or going to the processing elements, an interconnection network (INT) for directing the data between the processing elements and the memory banks, and a control unit (CTRL) for controlling the interconnection network and the memory banks. The control unit (CTRL) includes a calculation circuit (CAL) capable of the online generation of command words for the interconnection
(Continued)

network and addressing and control sequences of the memory banks, ensuring conflict-free memory access on the basis of the interleaving rule to be applied, the size of the digital data frames, the number of processing units and memory banks, and the interconnection network.

4 Claims, 2 Drawing Sheets

(52) U.S. Cl.
CPC ... *H03M 13/2775* (2013.01); *H03M 13/2789* (2013.01); *H03M 13/6513* (2013.01); *H03M 13/6519* (2013.01); *H03M 13/6569* (2013.01); *G06F 2212/251* (2013.01); *H03M 13/1102* (2013.01)

(58) Field of Classification Search
USPC .......................................................... 711/157
See application file for complete search history.

(56) References Cited

U.S. PATENT DOCUMENTS

| | | | |
|---|---|---|---|
| 8,578,238 B2 | 11/2013 | Priewasser et al. | |
| 2006/0155936 A1* | 7/2006 | Dunshea | G06F 9/3004 711/145 |
| 2009/0031094 A1 | 1/2009 | Chavet et al. | |
| 2010/0268918 A1* | 10/2010 | Priewasser | H03M 13/1105 712/208 |
| 2011/0066914 A1 | 3/2011 | Lee et al. | |
| 2012/0159092 A1* | 6/2012 | Dorbes | H04L 67/16 711/154 |

OTHER PUBLICATIONS

French Appln. No. 1251688 Search Report dated Jul. 24, 2012 (10 page including English translation).
Article, Wang et al., "*High-Throughput Contention-Free Concurrent Interleaver Architecture for Multi-Standard Turbo Decoder*", 2011 IEEE International Conference on Application-Specific Systems, Architectures and Processors (ASAP), Sep. 11, 2011, pp. 113-121, XP031975722, DOI: 10.1109/ASAP.2011.6043259 ISBN: 978-1-4577-1291-3 section "C. Related Work".
Article, Naesens et al., "*A Unified Instruction Set Programmable Architecture for Multi-Standard Advanced Forward Error Correction*", Signal Processing Systems, 2008, SIPS 2008. IEEE Workshop on IEEE, Piscataway, NJ, USA, Oct. 8, 2008 (Oct. 8, 2008), pp. 31-36, XP031361162, ISBN: 978-1-4244-2923-3 the whole document figure 4.
Summons and Annex to Summons dated Jan. 19, 2018 (14 pages including English translation) from corresponding European Application No. 13711578.8.

* cited by examiner

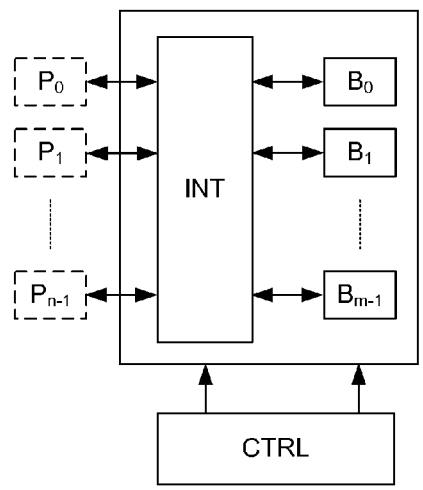
FIG. 1
(Prior art)
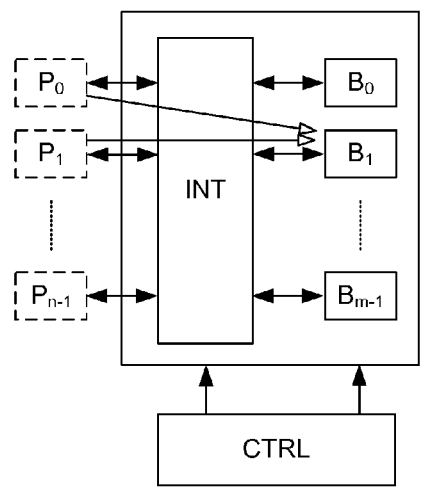 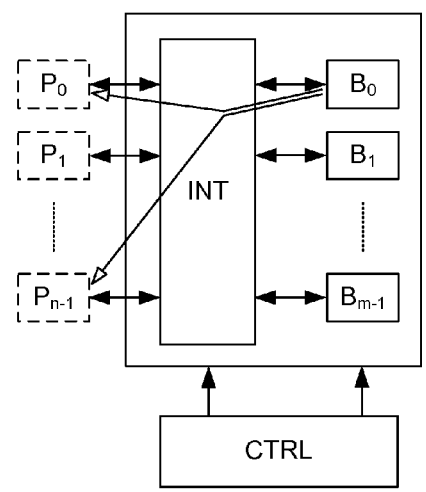
FIG. 2  FIG. 3

SELF-CONFIGURABLE DEVICE FOR INTERLEAVING/DEINTERLEAVING DATA FRAMES

This application claims priority to International Application No. PCT/EP2013/053613 filed Feb. 22, 2013; and French Patent Appln. 1251688 filed Feb. 23, 2012; the entire contents of each are incorporated herein by reference.

BACKGROUND

The present invention concerns a device for interleaving/deinterleaving digital data. The invention is situated in the field of the transmission of data at a high bit rate, for example audio and/or video signals. A particularly interesting application of the invention concerns the interleaving and/or deinterleaving of data for the coding and decoding of error correcting codes, in particular LDPC (Low Density Parity-Check) codes or turbo codes.

Error correcting codes of the LDPC codes type and turbo codes are well known in the prior art. Reference can be made for example to the prior French patent application FR 2 675 970, which describes the general principle of turbo codes.

These coding and decoding techniques are based on an iterative processing of data, the latter being mixed or interleaved, at each processing step, until a complete decorrelation of any errors that may have been conveyed is obtained. These techniques use an interleaver that performs an iterative permutation of the symbols of an input code.

FIG. 1 depicts the architecture of a known interleaving or deinterleaving device. This device is intended to interleave or deinterleave data delivered by n processing elements, referenced $P_0$ to $P_{n-1}$, disposed in parallel, said data representing symbols.

The interleaving or deinterleaving device comprises a set of m memory banks, referenced $B_0$ to $B_{m-1}$, disposed in parallel and intended to store data coming from or going to the n processing elements, and an interconnection network INT that is interposed between the processing elements and the memory banks in order at any moment to switch the data from the processing elements to the memory banks or vice versa. The data stored in the memory banks are operands and the results of the processing operations performed in the processing elements. The data to be stored in n of the m memory banks are conventionally generated simultaneously by the n processing elements. Generally, the number m of memory banks is greater than or equal to the number n of processing elements. In the contrary case, the data must be supplied by subset, the size of which is less than or equal to the number of memory banks.

The interconnection network INT and the memory banks are controlled by a dedicated control unit CTRL. More precisely, the control unit is responsible for supplying, at each moment, a command word to the interconnection network and addressing and control sequences to the memory banks in order to access the data in read or write mode. The control unit conventionally comprises a plurality of control memories of the ROM (Read-Only Memory) type and a control circuit for reading the content of these memories.

The control unit conventionally comprises at least one control memory for storing the command words of the interconnection network and a control memory for storing the addressing and control sequences of the memory banks. These sequences and command words depend on the interleaving or deinterleaving rule to be applied, the number n of processing elements, the number m of memory banks, the structure of the interconnection network and the size of the data frames (the number of symbols in the frame) to be processed. In general, the first four parameters, namely the interleaving or deinterleaving rule, the numbers n and m and the structure of the interconnection network, do not vary and are fixed by the equipment comprising the interleaving or deinterleaving device. In particular, the interleaving or deinterleaving rule is imposed by the transmission standard supported by the equipment. The equipment must however be in a position to manage several frame sizes for this standard, typically around a hundred frame sizes or even more. A particular operating mode of the interleaving or deinterleaving device is then associated with each of these frame sizes. For implementation of these various operating modes, the control unit of the interleaving or deinterleaving device generally comprises two control memories for each of the operating modes, namely a so-called network memory for storing the command words for the interconnection network and a so-called access control memory for storing the sequences for addressing and controlling the memory banks for the operating mode in question. As a result the control unit of the device comprises two control memories for each operating mode, the content of these memories generally being computed offline by a memory placement algorithm before being stored therein.

Such interleaving or deinterleaving devices are therefore relatively expensive in terms of surface on silicon since the majority of current and future transmission standards, for example WiMAX (Worldwide Interoperability for Microwave Access) or LTE (Long Term Evolution), are designed to implement several hundreds of operating modes.

Another problem related to the use of this type of interleaving architecture concerns conflict in access to the memory banks $B_0$ to $B_{m-1}$. This is because, as can be seen in FIGS. 2 and 3, with this type of architecture, it is possible that two or more processing elements from the elements $P_0$ to $P_{n-1}$ producing or using data attempt to write or on the other hand to read different data at the same time in or from the same memory bank. Collisions then occur and, in order to avoid them, it is then necessary to offset or carefully arbitrate accesses to the memory banks, which then slows down the coding or decoding process.

Solutions to this collision problem exist. These consist essentially of modifying the interleaving or deinterleaving rule or introducing elements storing in the interconnection network so that simultaneous accesses to the same memory bank are serialised or find an allocation of the data in the memory banks so that there are no access conflicts. Several techniques have been developed in this regard.

A first family of techniques is based on the definition of an interleaving rule based on one or more regular permutations, for example circular, making it possible to implement an interleaver having a high degree of parallelism with performances equivalent to or better than those of known interleavers, while reducing the complexity of the architecture of the interconnection network, in particular for applications at a very high bit rate. This type of solution also has the advantage of reducing the cost of the control unit by minimising the total number of control memories used. A first technique belonging to this family and called "real turbo codes" is described in detail in the document FR 2 838 581. The drawback of this technique is that it is based on the definition of an interleaving rule that is a priori not consistent with a communication standard. The standards have since changed in order to be based on more or less complex regular permutations making it possible to implement parallel hardware interleavers more easily. Unfortunately, the permutation rules proposed do not make it possible to eliminate all conflicts. This is because memory access conflicts persist for certain parallelisms and/or sizes of frames.

A second family of techniques proposes adding memories in the interconnection network in order to provide a time delay of the data in the event of a conflict situation. This type of approach does however have the drawback of increasing the latency of the circuit and increasing the complexity of the interconnection network. In addition, it is necessary to proceed by simulation in order to determine the sizing of the added memories. One example of a technique of this type is described in the document "SoC-Network for Interleaving in Wireless Communications" by N Wehn, MPSoC, 2004.

A third family of techniques consists of storing the data in memory banks so as to avoid conflicts. This approach consists of identifying the data that are intended to be consumed or produced at the same time in an allocation matrix. Although this family makes it possible to find an assignment of the data in the memory banks that does not give rise to a conflict whatever the interleaving rule, it does however have a certain number of drawbacks. This is because it does not make it possible to generate a memory access that is simple to implement while using simple components in the interconnection network. Moreover, this family requires the use of two control memories per operating mode for storing the natural and interleaved access orders, which further increases the cost of the device.

A first example of a technique belonging to this family is described in the article "Mapping Interleaving Laws to Parallel Turbo-decoder Architectures" by A Tarable, S Benedetto and G Montorsi, IEEE volume 8, March 2004. The approach proposed consists of effecting a first naive allocation of the data in the memory banks, without generating a conflict, and then attributing a memory bank to the non-allocated data while correcting the conflicts by means of a so-called "annealing" or "iterative refinement" method. The simulated annealing algorithm is relatively complex to use and does not make it possible to determine, a priori, the time necessary for obtaining the solution although this time is limited.

A second example is presented in the document FR 2 915 641 entitled "Data interleaving method and device". This document describes a method for finding, for any interleaving rule, a placement of the data in the memory banks that guarantees conflict-free access to the memories and optimises the interconnection network according to the requirements of the designer if the interleaving rule so permits. With this technique, the control unit is not optimised and its final architecture comprises as many control memories as there are memory banks, for all operating modes to be implemented.

SUMMARY

One aim of the invention is to overcome all or some of the drawbacks and limits of the prior art cited above.

In particular, one aim of the invention is to propose a device for interleaving or deinterleaving digital data that is able to implement, without memory access conflict, the interleaving or deinterleaving rule of any type of communication standard and in which the control unit has a small memory space and a small number of control memories.

Another aim of the invention is to propose a digital data interleaving or deinterleaving device having a control unit of reduced cost.

Another aim of the invention is to propose an interleaving or deinterleaving device that is applicable both to turbo codes and to LDPC codes.

To this end, it is proposed, according to the invention, to add to the control unit of the device a computing circuit able to execute a memory placement algorithm at each change of operating mode of the device. Thus, according to the invention, the memory placement algorithm is executed on the fly by the interleaving or deinterleaving device.

The subject matter of the invention is a device for interleaving or deinterleaving digital frames delivered by n processing elements disposed in parallel, n being a natural integer greater than 1, said device comprising m memory banks for storing data coming from or intended for said processing elements, m being a natural integer greater than 1, an interconnection network for switching the data between said processing elements and said memory banks, and a control unit comprising a control memory in which command words for the interconnection network and addressing and control sequences intended to control the memory banks are stored, said command words and said addressing and control sequences being dependent on an interleaving or deinterleaving rule to be applied, the size of the digital data frames, the number m and n and the interconnection network, and a control circuit for controlling the interconnection network and the memory banks with the command words and the addressing and control sequences stored in said control memory, remarkable in that the control unit further comprises a computing circuit able to generate command words and addressing and control sequences on line guaranteeing conflict-free memory access according to the interleaving rule to be applied, the size of the digital data frames, the number n of processing units, the number m of memory banks and the interconnection network, said control circuit being able to write the command words and the addressing and control sequences generated by said computing circuit in said control memory.

The computing circuit executes a memory placement algorithm guaranteeing conflict-free memory access whenever at least one of the following parameters changes:

digital data frame size,
interleaving or deinterleaving rule to be applied,
number n of processing elements of the device,
number m of memory banks of the device,
interconnection network.

The results are placed in the control memory by the control circuit. Thus it is no longer necessary to have a control memory for each of the possible operating modes of the device, which helps to reduce the cost of the device. Moreover, the memory placement algorithm is no longer executed offline but online.

According to a particular embodiment, the control memory comprises a memory, referred to as a network memory, for storing the command words for the interconnection network, and a so-called access control memory for storing the addressing and control sequences for the memory banks.

According to a particular embodiment, the network memory and the access control memory are volatile memories.

The device of the invention further comprises at least one computing memory for storing intermediate data generated by said computing circuit. This computing memory is for example a memory internal to the computing circuit or to the control unit. According to a particular embodiment, said computing memory is a memory portion of said memory banks.

The invention also concerns a device for coding or decoding digital data frames comprising n processing elements disposed in parallel, n being a natural integer greater than 1, and an interleaving or deinterleaving device as defined above for interleaving or deinterleaving the data frames produced by the processing element.

Other advantages may also appear to a person skilled in the art from a reading of the following examples, illustrated by the accompanying figures, given by way of illustration.

BRIEF DESCRIPTION OF THE DRAWINGS

FIG. 1, already described, depicts the functional diagram of an interleaving or deinterleaving device of the prior art;

FIGS. 2 and 3, already described, depict diagrams illustrating the collision problems with the device of FIG. 1.

DETAILED DESCRIPTION

Figure 4:
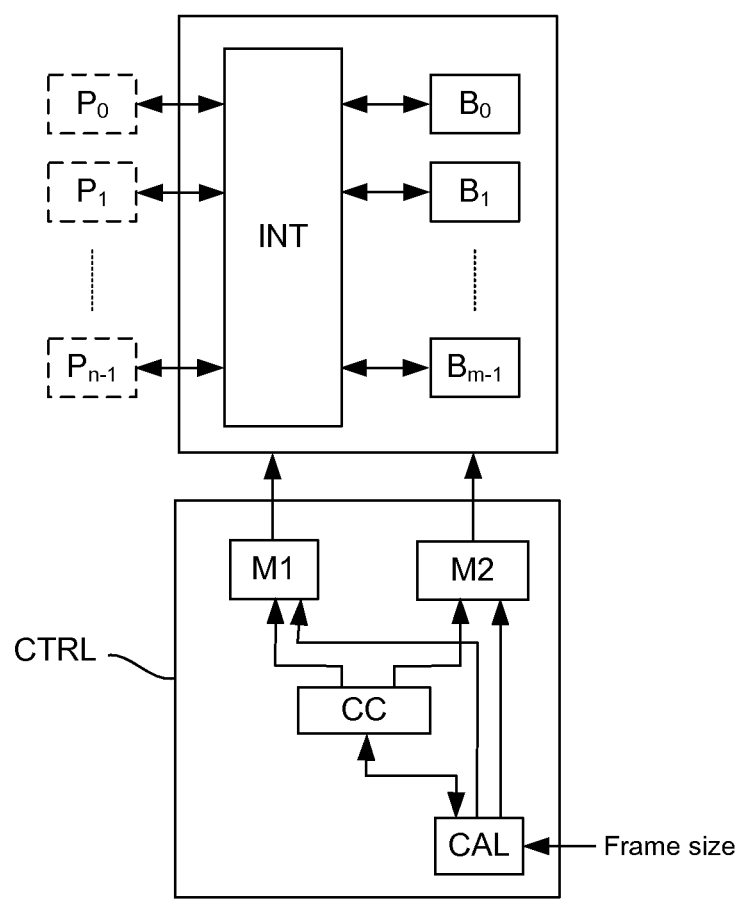
FIG. 4 depicts the functional diagram of an interleaving or deinterleaving device according to the invention.

According to the invention, it is proposed to install directly, in the control unit CTRL of the interleaving or deinterleaving device, a computing circuit able to execute on the fly an algorithm for placement of the digital data in the memory banks $B_0$ to $B_{m-1}$, without access conflict.

The control unit CTRL of the interleaving or deinterleaving device according to the invention is described with reference to FIG. 4. The control unit CTRL comprises a network memory M1 in which there are stored command words for the interconnection network and an access control memory M2 in which addressing and control sequences intended to control access to the memory banks are stored. The memories M1 and M2 are controlled in read and write mode by the control circuit CC. The command words and the addressing and control sequences stored in the memories M1 and M2 are generated by a computing circuit CAL.

According to the invention, the computing circuit CAL generates command words and addressing and control sequences guaranteeing conflict-free access to the memory banks $B_0$ to $B_{m-1}$, in read and write mode according to internal parameters that are not liable to be modified, such as the interleaving rule to be applied, the number n of processing elements $P_i$, working in parallel, the structure of the interconnection network (routing slips, shift registers, Benes network, etc.) and external parameters such as the size of the frames to be processed. For this purpose, the computing circuit CAL executes on the fly a memory placement algorithm guaranteeing conflict-free access according to said internal and external parameters and the results of this execution are stored in the memories M1 and M2. This algorithm is executed whenever one of the internal or external parameters is modified.

In the case of a communication terminal intended to function according to a given communication standard, the interleaving rule to be applied is the one imposed by the communication standard of the terminal, the interconnection network is that of the terminal and the number of processing elements working in parallel is generally the number n of processing elements $P_0$ to $P_{n-1}$ contained in the terminal for effecting the coding or decoding of the frames. The only parameter liable to vary is the size of the frames. In this case, the memory placement algorithm is then executed whenever the frame size changes. This example is illustrated by FIG. 4.

According to a variant, the terminal is capable of functioning according to a so-called degraded operating mode in which only some of the n processing elements are working, for example n/2, the other processing elements being switched off or put on standby in order to limit the power consumption of the terminal. In this case, the memory placement algorithm is executed whenever the frame size changes or a degraded operating mode is passed to.

In general terms, the memory placement algorithm is executed whenever one of the internal or external parameters is modified.

This algorithm is for example the low-complexity algorithm described in one of the following three documents:

the IEEE document entitled "A memory mapping approach for parallel interleaver design with multiple read and write accesses" by Cyrille Chavet and Philippe Coussy, published in "IEEE International Symposium on Circuits and Systems" (ISCAS), Paris (France);

the IEEE document entitled "An approach based on edge coloring of tripartite graph for designing parallel LDPC interleaver architecture" by Awais Sani, Philippe Coussy, Cyrille Chavet and Eric Martin, published in "IEEE International Symposium on Circuits and Systems" (ISCAS), 2011, Rio de Janeiro (Brazil);

the IEEE document entitled "A methodology based on transportation problem modeling for designing parallel interleaver architectures" by Awais Sani, Philippe Coussy, Cyrille Chavet and Eric Martin, published in $36^{th}$ IEEE International Conference on Acoustics, Speech and Signal Processing, 2011, Prague (Czech Republic).

When the computing circuit CAL executes the memory placement algorithm, the intermediate data are stored in internal memories of the control unit CTRL or optionally in the memory banks. Finally, the command words and the addressing and control sequences generated by the computing circuit are placed in the memories M1 and M2 by the control circuit CC. According to a particular embodiment, the memories M1 and M2 are two portions of the same control memory.

The computing circuit CAL is capable of generating the command words and the addressing and control sequences for all the operating modes of the new communication standards, for example LTE or WiMAX, if it is supplied with the interleaving rule to be applied, the number of processing elements P, working in parallel, the structure of the interconnection network to be controlled and the size of the frames. The algorithm is re-executed whenever one of these parameters is modified. All the operating modes of a communication standard can be implemented without having to use tens or even hundreds of ROM memories in the device.

Although the invention has been described in relation to a particular embodiment, it is quite clear that it is in no way limited thereto and that it comprises all technical equivalents of the means described as well as combinations thereof if these fall within the scope of the invention.

The invention claimed is:

1. Device for interleaving or deinterleaving digital frames delivered by n processing elements ($P_0$ to $P_{n-1}$) disposed in parallel, n being a natural integer greater than 1, said device comprising:

m memory banks ($B_0 \ldots B_{m-1}$) for storing data coming from or intended for said processing elements, m being a natural integer greater than 1, an interconnection network for switching the data between said processing elements and said memory banks, and a control unit comprising a control memory in which command words for the interconnection network and addressing and control sequences intended to control the memory banks are stored, said command words and said addressing and control sequences being dependent on an interleaving or deinterleaving rule to be applied, the size of the digital data frames, the number m and n and the interconnection network, and a control circuit for controlling the interconnection network and the memory banks with the command words and the addressing and control sequences stored in said control memory, wherein the control unit further comprises a computing circuit to generate command words and addressing and control sequences on the fly guaranteeing conflict-free memory access according to the interleaving rule to be applied, the size of the digital data frames, the number n of processing units, the number m of memory banks and the interconnection network, said control circuit being able to write the command words and the addressing and control sequences generated by said computing circuit in said control memory, and wherein the computing circuit executes a memory placement algorithm guaranteeing conflict-free memory access whenever at least one of the following parameters changes:

digital data frame size, interleaving or deinterleaving rule to be applied, number n of processing elements of the device, number m of memory banks of the device, interconnection network.

2. The device according to claim 1, wherein the control memory comprises a network memory (M1), for storing the command words for the interconnection network, and an access control memory (M2) for storing the addressing and control sequences for the memory banks.

3. The device according to claim 2, wherein the network memory and the access control memory are volatile memories.

4. A device for coding or decoding digital data frames, comprising n processing elements disposed in parallel, n being a natural integer greater than 1, wherein the device further comprises an interleaving or deinterleaving device according to claim 1.

* * * * *